(12) United States Patent  
Saito

(10) Patent No.: US 11,753,329 B2  
(45) Date of Patent: Sep. 12, 2023

(54) GLASS PLATE AND METHOD FOR MANUFACTURING SAME

(71) Applicant: Nippon Electric Glass Co., Ltd., Shiga (JP)

(72) Inventor: Atsuki Saito, Shiga (JP)

(73) Assignee: NIPPON ELECTRIC GLASS CO., LTD., Shiga (JP)

(*) Notice: Subject to any disclaimer, the term of this patent is extended or adjusted under 35 U.S.C. 154(b) by 0 days.

(21) Appl. No.: 16/495,978

(22) PCT Filed: Mar. 12, 2018

(86) PCT No.: PCT/JP2018/009513  
§ 371 (c)(1),  
(2) Date: Sep. 20, 2019

(87) PCT Pub. No.: WO2018/173833  
PCT Pub. Date: Sep. 27, 2018

(65) Prior Publication Data  
US 2020/0131074 A1    Apr. 30, 2020

(30) Foreign Application Priority Data

Mar. 22, 2017 (JP) ................................. 2017-055429

(51) Int. Cl.  
*C03C 3/087* (2006.01)  
*C03C 3/091* (2006.01)  
(Continued)

(52) U.S. Cl.  
CPC .............. *C03C 3/087* (2013.01); *C03B 17/06* (2013.01); *C03C 3/091* (2013.01); *H10K 50/00* (2023.02); *H10K 77/10* (2023.02)

(58) Field of Classification Search  
CPC ......... C03C 3/087; C03C 3/091; C03B 17/06; H01L 51/0096; H01L 51/50  
See application file for complete search history.

(56) References Cited

U.S. PATENT DOCUMENTS 10,590,026 B2 * 3/2020 Saito .................. C03C 3/091  
2013/0225390 A1 * 8/2013 Ellison .................. C03C 3/093  
501/66

(Continued)

FOREIGN PATENT DOCUMENTS

JP  2016-007445    1/2016  
JP  2016113361  *  6/2016

(Continued)

OTHER PUBLICATIONS

WO2015056645 translation via EspaceNet (Year: 2015).*

(Continued)

*Primary Examiner* — Karl E Group  
*Assistant Examiner* — Cameron K Miller  
(74) *Attorney, Agent, or Firm* — Wenderoth, Lind & Ponack, L.L.P.

(57) ABSTRACT

A glass sheet of the present invention has a content of $Li_2O+Na_2O+K_2O$ of from 0 mol % to less than 1.0 mol % and a content of $B_2O_3$ of from 0 mol % to less than 2.0 mol % in a glass composition, has a β-OH value of less than 0.20/mm, and has a thermal shrinkage ratio of 20 ppm or less when increased in temperature from normal temperature at a rate of 5° C./min, kept at a temperature of 500° C. for 1 hour, and decreased in temperature at a rate of 5° C./min.

14 Claims, 1 Drawing Sheet

(51) Int. Cl.
*C03B 17/06* (2006.01)
*H01L 51/00* (2006.01)
*H01L 51/50* (2006.01)
*H10K 50/00* (2023.01)
*H10K 77/10* (2023.01)

(56) References Cited

U.S. PATENT DOCUMENTS

| | | | |
|---|---|---|---|
| 2014/0287905 A1* | 9/2014 | Tokunaga | C03C 3/087 |
| | | | 501/66 |
| 2018/0044223 A1 | 2/2018 | Hayashi | |
| 2018/0141849 A1* | 5/2018 | Saito | C03B 17/06 |
| 2018/0148367 A1 | 5/2018 | Hayashi | |
| 2018/0190675 A1 | 7/2018 | Ichikawa | |

FOREIGN PATENT DOCUMENTS

| | | | | |
|---|---|---|---|---|
| WO | WO-2015056645 A1 * | 4/2015 | | C03C 3/087 |
| WO | 2016/143665 | 9/2016 | | |
| WO | 2016/185 976 | 11/2016 | | |
| WO | 2016/194693 | 12/2016 | | |
| WO | 2017/002808 | 1/2017 | | |

OTHER PUBLICATIONS

JP2016113361 translation via EspaceNet (Year: 2016).*
International Search Report dated May 22, 2018 in International (PCT) Application No. PCT/JP2018/009513.
International Preliminary Report on Patentability dated Sep. 24, 2019 in International (PCT) Patent Application No. PCT/JP2018/009513.
Request for the Submission of an Opinion dated Sep. 7, 2022 in corresponding Korean Application No. 10-2019-7022541 with English translation.
Notice of Reasons for Refusal dated Mar. 16, 2023 in corresponding Japanese Application No. 2021-167809, with English-language translation.

* cited by examiner

GLASS PLATE AND METHOD FOR MANUFACTURING SAME

TECHNICAL FIELD

The present invention relates to a glass sheet, and more specifically, to a glass sheet suitable as a substrate of a flat panel display, such as a liquid crystal display or an OLED display.

BACKGROUND ART

An OLED device, such as an OLED display, is used in applications such as displays of cellular phones because the OLED device is thin, is excellent in displaying a moving image, and has low power consumption.

A glass sheet is widely used as a substrate of the OLED display. Glass substantially free of an alkali metal oxide, or glass having a low content of an alkali metal oxide is used for the glass sheet of this application. That is, low-alkali glass is used for the glass sheet of this application. When the low-alkali glass is used, a situation in which an alkali ion is diffused in a heat treatment step into a semiconductor substance having been formed into a film can be prevented.

In recent years, a smart phone or a mobile terminal has required a display with high definition, and a low-temperature poly-silicon (LTPS) TFT has often been used as a semiconductor of a driving thin-film transistor (TFT).

In general, the glass sheet of this application is required to satisfy the following characteristics (1) and (2), but it is known that the characteristics (1) and (2) are in a trade-off relationship and achievement of both the characteristics (1) and (2) is significantly difficult.
(1) To less devitrify during forming, that is, have high devitrification resistance (for example, have a liquidus temperature of 1,300° C. or less), and have a low melting temperature (for example, have a temperature at a viscosity at high temperature of $10^{2.5}$ dPa·s of 1,680° C. or less) in order to increase productivity of a thin glass sheet.
(2) To have high heat resistance in order to reduce thermal shrinkage of the glass sheet in a production process for, for example, a poly-Si TFT, particularly a low-temperature poly-Si TFT.

CITATION LIST

Patent Literature 1: JP 2016-07445 A

SUMMARY OF INVENTION

Technical Problem

Incidentally, the heat resistance of the glass sheet can be increased by reducing a water content in glass. This effect is larger than those exhibited by increasing or decreasing the amounts of glass components. Therefore, when the water content in the glass is reduced, a glass composition having high devitrification resistance can be adopted. Thus, both the above-mentioned demand characteristics (1) and (2) can be achieved.

However, it is significantly difficult to reduce the water content in the glass at the time of mass production. This is also apparent from the fact that a commercially available glass sheet has a large water content, for example, a β-OH value of more than 0.20/mm.

The present invention has been made in view of the above-mentioned circumstances, and a technical object of the present invention is to devise a glass sheet having high heat resistance while having satisfactory productivity.

Solution to Problem

The inventor of the present invention has repetitively performed various experiments, and as a result, has found that the above-mentioned technical object can be achieved by reducing the contents of alkali metal oxides and $B_2O_3$ in a glass composition, and reducing a water content in glass. Thus, the finding is proposed as the present invention. That is, according to one embodiment of the present invention, there is provided a glass sheet, which has a content of $Li_2O+Na_2O+K_2O$ of from 0 mol % to less than 1.0 mol % and a content of $B_2O_3$ of from 0 mol % to less than 2.0 mol % in a glass composition, which has a β-OH value of less than 0.20/mm, and which has a thermal shrinkage ratio of 20 ppm or less when increased in temperature from normal temperature at a rate of 5° C./min, kept at a temperature of 500° C. for 1 hour, and decreased in temperature at a rate of 5° C./min. Herein, the content of "$Li_2O+Na_2O+K_2O$" refers to the total content of $Li_2O$, $Na_2O$, and $K_2O$. The "strain point" refers to a value measured in accordance with ASTM C336. The "β-OH value" refers to a value calculated from the following equation 1 based on transmittances measured with an FT-IR.

$$\beta\text{-OH value}=(1/X)\log(T_1/T_2)$$

X: Thickness (mm)
$T_1$: Transmittance (%) at a reference wavelength of 3,846 $cm^{-1}$
$T_2$: Minimum transmittance (%) at a wavelength around a hydroxyl group absorption wavelength of 3,600 $cm^{-1}$ The "thermal shrinkage ratio" is measured as described below. A sheet-shaped sample is marked with a linear mark at a predetermined position, and then bent perpendicular to the mark to be divided into two glass pieces. Then, one of the glass pieces is subjected to predetermined heat treatment (the glass piece is increased in temperature from normal temperature at a rate of 5° C./min, kept at a temperature of 500° C. for 1 hour, and decreased in temperature at a rate of 5° C./min). After that, the glass piece having been subjected to the heat treatment and another glass piece not having been subjected to the heat treatment are arranged next to each other, and are fixed with an adhesive tape T. Then, a shift between the marks is measured. The thermal shrinkage ratio is determined by the expression $\Delta L/L_0$ (unit: ppm) when the shift is represented by $\Delta L$ and the length of the original sample is represented by $L_0$.

The glass sheet according to the embodiment of the present invention has a content of $Li_2O+Na_2O+K_2O$ of from 0 mol % to less than 1.0 mol % and a content of $B_2O_3$ of from 0 mol % to less than 2.0 mol % in the glass composition, and has a β-OH value of less than 0.20/mm. With this, the heat resistance of the glass sheet is improved as an original effect exhibited by the glass composition, and is further improved as an effect exhibited by reducing the water content. As a result, the thermal shrinkage of the glass sheet can be significantly reduced in a production process for, for example, a p-Si TFT, particularly a low-temperature p-Si TFT.

In addition, it is preferred that the glass sheet according to the embodiment of the present invention have a content of $B_2O_3$ of from 0 mol % to less than 1.0 mol % in the glass composition, and have a β-OH value of 0.15/mm or less.

In addition, it is preferred that the glass sheet according to the embodiment of the present invention have a thickness of from 0.03 mm to 0.6 mm, and comprise as a glass composition, in terms of mol %, 60% to 75% of $SiO_2$, 8% to 16% of $Al_2O_3$, 0% to less than 2.0% of $B_2O_3$, 0% to less than 1.0% of $Li_2O+Na_2O+K_2O$, 1% to 7% of MgO, 2% to 10% of CaO, 0% to 5% of SrO, 0% to 7% of BaO, 0% to less than 0.050% of $As_2O_3$, and 0% to less than 0.050% of $Sb_2O_3$. With this, the glass sheet having high heat resistance is easily reduced in thickness by an overflow down-draw method or the like.

In addition, it is preferred that the glass sheet according to the embodiment of the present invention have a content of $Fe_2O_3$ of 10 ppm or more and less than 100 ppm on a molar basis in the glass composition.

In addition, it is preferred that the glass sheet according to the embodiment of the present invention have a content of $Na_2O$ of 100 ppm or more and less than 600 ppm on a molar basis in the glass composition.

In addition, it is preferred that the glass sheet according to the embodiment of the present invention has a strain point of 710° C. or more.

In addition, it is preferred that the glass sheet according to the embodiment of the present invention have a liquidus temperature of 1,300° C. or less. Herein, the "liquidus temperature" refers to a temperature at which devitrification (devitrified crystal) is observed in glass when glass powder which has passed through a standard 30-mesh sieve (500 µm) and remained on a 50-mesh sieve (300 µm) is placed in a platinum boat and kept for 24 hours in a gradient heating furnace, followed by taking the platinum boat out of the gradient heating furnace.

In addition, it is preferred that the glass sheet according to the embodiment of the present invention have a temperature at a viscosity of $10^{2.5}$ dPa·s of 1,680° C. or less. Herein, the "temperature at a viscosity of $10^{2.5}$ dPa·s" may be measured by a platinum sphere pull up method.

In addition, it is preferred that the glass sheet according to the embodiment of the present invention comprise a formed joined surface on a center portion in a thickness direction, that is, be formed by an overflow down-draw method. Herein, the "overflow down-draw method" refers to a method in which molten glass is caused to overflow from both sides of a heat-resistant, trough-shaped structure, and the overflowing molten glasses are subjected to down-draw downward at the lower end of the trough-shaped structure while being joined, to thereby produce a glass sheet.

In addition, it is preferred that the glass sheet according to the embodiment of the present invention be used for a substrate of an OLED device.

According to one embodiment of the present invention, there is provided a method of producing a glass sheet, comprising: a blending step of blending a glass batch so as to obtain glass comprising as a glass composition, in terms of mol %, 60% to 75% of $SiO_2$, 8% to 16% of $Al_2O_3$, 0% to less than 2.0% of $B_2O_3$, 0% to less than 1.0% of $Li_2O+Na_2O+K_2O$, 1% to 7% of MgO, 2% to 10% of CaO, 0% to 5% of SrO, 0% to 7% of BaO, 0% to less than 0.050% of $As_2O_3$, and 0% to less than 0.050% of $Sb_2O_3$; a melting step of heating the resultant glass batch through application of a current with a heating electrode to obtain molten glass; and a forming step of forming, by an overflow down-draw method, the resultant molten glass into a glass sheet having a β-OH value of less than 0.20/mm, and having a thermal shrinkage ratio of 20 ppm or less when increased in temperature from normal temperature at a rate of 5° C./min, kept at a temperature of 500° C. for 1 hour, and decreased in temperature at a rate of 5° C./min.

In addition, it is preferred that the method of producing a glass sheet according to the embodiment of the present invention comprise heating the resultant glass batch through application of a current with a molybdenum electrode to obtain the molten glass.

In addition, it is preferred that the method of producing a glass sheet according to the embodiment of the present invention comprise forming the resultant molten glass into a glass sheet having a thickness of from 0.03 mm to 0.6 mm.

DESCRIPTION OF EMBODIMENTS

Figure 1:
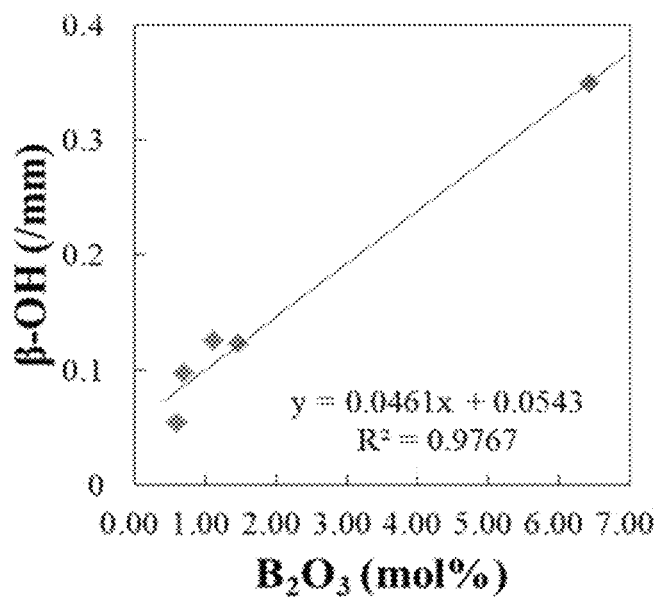
FIG. 1 is a graph for showing a relationship between the content of $B_2O_3$ and a β-OH value in the cases of Sample Nos. 1, 3, 5, 7, and 9 described in the "Examples" section.

A glass sheet of the present invention has a content of $Li_2O+Na_2O+K_2O$ of from 0 mol % to less than 1.0 mol % in a glass composition. $Li_2O$, $Na_2O$, and $K_2O$ are each a component which deteriorates the characteristics of a semiconductor film, and are each also a component which significantly reduces a strain point. Therefore, the total content and individual contents of $Li_2O$, $Na_2O$, and $K_2O$ are each preferably less than 1.0%, less than 0.5%, less than 0.2%, or less than 0.1%, particularly preferably less than 0.06%. Meanwhile, when $Li_2O$, $Na_2O$, and $K_2O$ are introduced in small amounts, the electrical resistivity of molten glass is reduced, and a glass batch is easily melted by heating through application of a current with a heating electrode. Therefore, the total content and individual contents of $Li_2O$, $Na_2O$, and $K_2O$ are each preferably 0.01% or more, 0.02% or more, 0.03% or more, or 0.04% or more, particularly preferably 0.05% or more. In particular, it is preferred to introduce, out of $Li_2O$, $Na_2O$, and $K_2O$, $Na_2O$ preferentially in view of balance between an adverse effect on the semiconductor characteristics and a reduction in electrical resistivity.

The glass sheet of the present invention has a content of $B_2O_3$ of from 0 mol % to less than 2.0 mol % in the glass composition. With this, the strain point is increased as an original effect exhibited by the glass composition, and further, the water content in glass is easily reduced, and the strain point is further increased as an effect exhibited by reducing the water content.

The upper limit of the content range of $B_2O_3$ is preferably 1.5 mol % or less, 1 mol % or less, less than 1.0 mol %, 0.7 mol % or less, or 0.5 mol % or less, particularly preferably less than 0.1 mol %. Meanwhile, when the content of $B_2O_3$ is too small, a devitrified crystal containing Al is liable to precipitate, and meltability is liable to be reduced. The lower limit of the content range of $B_2O_3$ is preferably 0.01 mol % or more, 0.1 mol % or more, 0.2 mol % or more, or 0.3 mol % or more, particularly preferably 0.4 mol % or more.

A raw material for introducing $B_2O_3$ is liable to absorb water in the air, and hence contains a large amount of water. Therefore, when the content of $B_2O_3$ is reduced, the ratio of the raw material for introducing $B_2O_3$ in the glass batch is reduced, and hence an increase in water content resulting from a glass raw material can be suppressed.

Further, the raw material for introducing $B_2O_3$ melts at low temperature, and hence has a function of aiding melting of other glass raw materials. Therefore, when the content of $B_2O_3$ is reduced, the ratio of the raw material for introducing $B_2O_3$ in the glass batch is reduced, and hence it takes a long time for the glass batch to react to become molten glass, and the glass batch is present under a solid state in a melting kiln for a long time. As a result, water having adhered to the glass batch evaporates in the melting kiln, and an increase in water content resulting from the glass raw material can be further suppressed.

When the glass batch is pre-sintered, an increase in water content resulting from the glass raw material can be suppressed, but an incidental facility for pre-sintering or the like needs to be installed, resulting in an increase in production cost of the glass sheet. Meanwhile, in the glass sheet of the present invention, an increase in water content resulting from the glass raw material can be suppressed without installing the incidental facility for pre-sintering or the like.

The glass sheet of the present invention has a β-OH value of preferably less than 0.20/mm, less than 0.18/mm, 0.15/mm or less, 0.13/mm or less, less than 0.10/mm, 0.09/mm or less, 0.08/mm or less, 0.07/mm or less, or 0.06/mm or less, particularly preferably from 0.01/mm to less than 0.05/mm. When the β-OH value is high, the strain point is reduced, and a thermal shrinkage ratio is liable to be increased.

A method of reducing the β-OH value is exemplified by the following methods (1) to (7). Of those, the methods (1) to (4) are effective.

(1) A method involving selecting raw materials having low water contents. (2) A method involving melting a glass batch by heating through application of a current with a heating electrode. (3) A method involving adopting a small melting furnace. (4) A method involving adding a drying agent, such as $SO_3$ or Cl, into a glass batch. (5) A method involving reducing the water content in a furnace atmosphere. (6) A method involving increasing the flow rate of molten glass. (7) A method involving performing $N_2$ bubbling in molten glass.

The glass sheet of the present invention has a thermal shrinkage ratio of preferably 20 ppm or less, from 1 ppm to 15 ppm, or from 3 ppm to 12 ppm, particularly preferably from 5 ppm to 10 ppm when increased in temperature from normal temperature at a rate of 5° C./min, kept at a temperature of 500° C. for 1 hour, and decreased in temperature at a rate of 5° C./min. When the thermal shrinkage ratio is high, a yield of panel production is liable to be reduced in a production process for, for example, a poly-Si TFT, particularly a low-temperature poly-Si TFT.

It is preferred that the glass sheet of the present invention comprise as a glass composition, in terms of mol %, 60% to 75% of $SiO_2$, 8% to 16% of $Al_2O_3$, 0% to less than 2.0% of $B_2O_3$, 0% to less than 1.0% of $Li_2O+Na_2O+K_2O$, 1% to 7% of MgO, 2% to 10% of CaO, 0% to 5% of SrO, 0% to 7% of BaO, 0% to less than 0.050% of $As_2O_3$, and 0% to less than 0.050% of $Sb_2O_3$. The reasons why the contents of the components are limited as described above are described below. The expression "%" represents "mol %" in the descriptions of the contents of the components.

The content of $SiO_2$ is preferably from 60% to 75%. The lower limit of the content range of $SiO_2$ is preferably 62% or more or 65% or more, particularly preferably 67% or more, and the upper limit of the content range of $SiO_2$ is preferably 73% or less or 72% or less, particularly preferably 71% or less. When the content of $SiO_2$ is too small, a devitrified crystal containing $Al_2O_3$ is liable to be generated, and in addition, a strain point is liable to be reduced. Meanwhile, when the content of $SiO_2$ is too large, a viscosity at high temperature increases, and thus meltability is liable to be reduced. In addition, a devitrified crystal, such as cristobalite, precipitates, and a liquidus temperature is liable to be increased.

The content of $Al_2O_3$ is preferably from 8% to 16%. The lower limit of the content range of $Al_2O_3$ is preferably 9.5% or more, 10% or more, or 10.5% or more, particularly preferably 11% or more, and the upper limit of the content range of $Al_2O_3$ is preferably 15% or less or 14% or less, particularly preferably 13% or less. When the content of $Al_2O_3$ is too small, the strain point is liable to be reduced, and in addition, glass is liable to undergo phase separation. Meanwhile, when the content of $Al_2O_3$ is too large, the devitrified crystal, such as mullite or anorthite, precipitates, and the liquidus temperature is liable to be increased.

The preferred content ranges of $B_2O_3$ and $Li_2O$, $Na_2O$, and $K_2O$ are as described above.

A molar ratio $Na_2O/B_2O_3$ is preferably 0.01 or more, 0.02 or more, 0.03 or more, or 0.05 or more, particularly preferably from 0.1 to 0.5 from the viewpoint of reducing the electrical resistivity of the molten glass.

MgO is a component which reduces the viscosity at high temperature and thus increases the meltability. In addition, MgO also has an increasing effect on a Young's modulus. The content of MgO is preferably from 1% to 7%, from 2% to 6.5%, or from 3% to 6%, particularly preferably from 4% to 6%. When the content of MgO is too large, the strain point is liable to be reduced.

CaO is a component which reduces the viscosity at high temperature and thus remarkably increases the meltability without reducing the strain point. In addition, a raw material for introducing CaO is relatively inexpensive among those for alkaline earth metal oxides, and hence CaO is a component which achieves a reduction in raw material cost. The content of CaO is preferably from 2% to 10%, from 3% to 9%, or from 4% to 8%, particularly preferably from 5% to 7%. When the content of CaO is too small, it becomes difficult to exhibit the above-mentioned effects. Meanwhile, when the content of CaO is too large, a thermal expansion coefficient is increased, and the liquidus temperature of an anorthite crystal is liable to be increased.

SrO is a component which increases the devitrification resistance, and is also a component which reduces the viscosity at high temperature and thus increases the meltability without reducing the strain point. The content of SrO is preferably from 0% to 5%, from 0% to 4%, from 0.1% to 3%, or from 0.3% to 2%, particularly preferably from 0.5% to less than 1.0%. When the content of SrO is too small, it becomes difficult to exhibit a suppressing effect on phase separation or an increasing effect on the devitrification resistance. Meanwhile, when the content of SrO is too large, a density is increased, or a component balance of the glass composition is impaired, and an anorthite or a strontium aluminosilicate-based devitrified crystal is liable to precipitate.

BaO is a component which remarkably increases the devitrification resistance among the alkaline earth metal oxides. The content of BaO is preferably from 0% to 7%, from 1% to 7%, or from 2% to 6%, particularly preferably from 3% to 5%. When the content of BaO is too small, the liquidus temperature is increased, and thus the devitrification resistance is liable to be reduced. Meanwhile, when the content of BaO is too large, the Young's modulus is reduced, and the density of the glass is excessively increased.

The content of RO (the total content of MgO, CaO, SrO, and BaO) is preferably from 12% to 18%, from 13% to 17.5%, from 13.5% to 17%, particularly preferably from 14% to 16.8%. When the content of RO is too small, the meltability is liable to be reduced. Meanwhile, when the content of RO is too large, the component balance of the glass composition is impaired, and the devitrification resistance is liable to be reduced.

$As_2O_3$ and $Sb_2O_3$ are each a component which increases an environmental load. The content of each of $As_2O_3$ and $Sb_2O_3$ is preferably less than 0.05% or less than 0.01%, particularly preferably less than 0.005%.

Other than the above-mentioned components, for example, the following components may be added to the glass composition. From the viewpoint of exhibiting the effects of the present invention appropriately, the total content of the components other than the above-mentioned components is preferably 10% or less, particularly preferably 5% or less.

ZnO is a component which increases the meltability. However, when ZnO is contained in a large amount, the glass is liable to devitrify, and in addition, the strain point is liable to be reduced. The content of ZnO is preferably from 0% to 5%, from 0% to 3%, or from 0% to 0.5%, particularly preferably from 0% to 0.2%.

$P_2O_5$ is a component which increases the strain point. However, when $P_2O_5$ is contained in a large amount, the glass is liable to undergo phase separation. The content of $P_2O_5$ is preferably from 0% to 1.5% or from 0% to 1.2%, particularly preferably from 0% to 1%.

$TiO_2$ is a component which reduces the viscosity at high temperature and thus increases the meltability, and is also a component which suppresses solarisation. However, when $TiO_2$ is contained in a large amount, the glass is colored, and thus a transmittance is liable to be reduced. Therefore, the content of $TiO_2$ is preferably from 0% to 3%, from 0% to 1%, or from 0% to 0.1%, particularly preferably from 0% to 0.02%.

$Fe_2O_3$ is a component which is inevitably mixed as an impurity, and is a component which reduces the electrical resistivity of the molten glass. The content of $Fe_2O_3$ is preferably from 10 ppm to 150 ppm, from 30 ppm to less than 100 ppm, or from 40 ppm to 90 ppm, particularly preferably from 50 ppm to 80 ppm on a molar basis. When a small content of $Fe_2O_3$ is introduced, the electrical resistivity of the molten glass is reduced, and the glass batch is easily melted by heating through application of a current with a heating electrode. Meanwhile, when the content of $Fe_2O_3$ is too large, the glass sheet is liable to be colored. When the glass sheet is used as a carrier glass for a substrate of an OLED display, it is important to have a high transmittance in an ultraviolet region because a laser in the ultraviolet region is used for peeling the substrate and the carrier glass from each other. In this case, the content of $Fe_2O_3$ is preferably smaller.

$Y_2O_3$, $Nb_2O_5$, and $La_2O_3$ each have an action of increasing the strain point, the Young's modulus, and the like. However, when the contents of those components are too large, the density and the raw material cost are liable to be increased. Therefore, the content of each of $Y_2O_3$, $Nb_2O_5$, and $La_2O_3$ is preferably from 0% to 3%, from 0% to less than 1.0%, or from 0% to less than 0.2%, particularly preferably from 0% to 0.1%.

$SO_3$ is a component which reduces the β-OH value. Therefore, the lower limit of the content of $SO_3$ is preferably 1 ppm or more, particularly preferably 2 ppm or more on a molar basis. However, when the content of $SO_3$ is too large, reboil bubbles are liable to be generated. Therefore, the upper limit of the content of $SO_3$ is preferably 100 ppm or less or 50 ppm or less, particularly preferably 10 ppm or less on a molar basis.

Cl is a component which reduces the β-OH value. Therefore, when Cl is introduced, the lower limit of the content of Cl is preferably 0.05% or more or 0.10% or more, particularly preferably 0.14% or more. However, when the content of Cl is too large, a metal part in a glass production facility is liable to be corroded, and the productivity of the glass sheet is liable to be reduced. Therefore, the upper limit of the content of Cl is preferably 0.5% or less or 0.1% or less, particularly preferably 0.05% or less. As a raw material for introducing Cl, for example, a chloride of an alkaline earth metal, such as strontium chloride, or aluminum chloride may be used.

$SnO_2$ is a component which exhibits a satisfactory fining action in a high-temperature region, is also a component which increases the strain point, and is also a component which reduces the viscosity at high temperature. The content of $SnO_2$ is preferably from 0% to 1%, from 0.01% to 1%, or from 0.05% to 0.5%, particularly preferably from 0.1% to 0.3%. When the content of $SnO_2$ is too large, a devitrified crystal of $SnO_2$ is liable to precipitate. When the content of $SnO_2$ is less than 0.001%, it becomes difficult to exhibit the above-mentioned effects.

A fining agent other than $SnO_2$ may be used unless the characteristics of the glass are significantly impaired. Specifically, $CeO_2$, F, and C may be added up to, for example, 1% in terms of their total content. Metal powders, such as Al powder and Si powder, may be added up to, for example, 1% in terms of their total content. The contents of $As_2O_3$ and $Sb_2O_3$ are each preferably reduced to less than 0.050% from an environmental viewpoint.

The glass sheet of the present invention preferably has the following characteristics.

The strain point is preferably 710° C. or more, 720° C. or more, 730° C. or more, or from 740° C. to 820° C., particularly preferably from 750° C. to 800° C. With this, thermal shrinkage of the glass sheet can be reduced in a production process for a low-temperature poly-Si TFT or the like.

The liquidus temperature is preferably 1,300° C. or less, 1,280° C. or less, 1,260° C. or less, or 1,240° C. or less, particularly preferably from 800° C. to 1,220° C. A viscosity at a liquidus temperature is preferably $10^{4.8}$ poise or more, $10^{5.0}$ poise or more, or $10^{5.2}$ poise or more, particularly preferably from $10^{5.3}$ poise to $10^{7.0}$ poise. With this, the generation of a devitrified crystal can be suppressed during forming. As a result, the glass sheet is easily formed by an overflow down-draw method, and surface quality of the glass sheet can be improved. The liquidus temperature and the viscosity at a liquidus temperature are indicators of the devitrification resistance, and as the liquidus temperature becomes lower, the devitrification resistance becomes more excellent. In addition, when the viscosity at a liquidus temperature becomes higher, the devitrification resistance becomes more excellent. The "viscosity at a liquidus temperature" may be measured by a platinum sphere pull up method.

A temperature at a viscosity of $10^{2.5}$ poise is preferably 1,680° C. or less, 1,650° C. or less, 1,640° C. or less, 1,630° C. or less, or 1,620° C. or less, particularly preferably from 1,450° C. to 1,610° C. When the temperature at a viscosity of $10^{2.5}$ poise is high, the meltability and a fining property are reduced, and the production cost of the glass sheet is increased.

The glass sheet of the present invention has a thickness of preferably from 0.03 mm to 0.6 mm, from 0.05 mm to 0.55 mm, or from 0.1 mm to 0.5 mm, particularly preferably from 0.2 mm to 0.4 mm. When the thickness is smaller, reductions in weight and thickness of a display are easily achieved. However, when the thickness is small, it is highly necessary to increase a forming speed (sheet-drawing speed). In this case, the thermal shrinkage ratio of the glass sheet is liable to be increased. In the present invention, such situation can be effectively suppressed even at high forming speed (sheet-drawing speed) because the glass sheet has high heat resistance.

It is preferred that the glass sheet of the present invention have a formed joined surface on a center portion in a thickness direction, that is, be formed by an overflow down-draw method. Through the forming by the overflow down-draw method, surfaces to serve as the surfaces of the glass sheet are formed in a state of free surfaces without being brought into contact with a trough-shaped refractory. As a result, a glass sheet having satisfactory surface quality can be produced at low cost without polishing. In addition, the overflow down-draw method also has the advantage of easy forming of a glass sheet having a small thickness.

A method of producing a glass sheet of the present invention comprises: a blending step of blending a glass batch so as to obtain glass comprising as a glass composition, in terms of mol, 60% to 75% of $SiO_2$, 8% to 16% of $Al_2O_3$, 0% to less than 2.0% of $B_2O_3$, 0% to less than 1.0% of $Li_2O+Na_2O+K_2O$, 1% to 7% of MgO, 2% to 10% of CaO, 0% to 5% of SrO, 0% to 7% of BaO, 0% to less than 0.050% of $As_2O_3$, and 0% to less than 0.050% of $Sb_2O_3$; a melting step of heating the resultant glass batch through application of a current with a heating electrode to obtain molten glass; and a forming step of forming, by an overflow down-draw method, the resultant molten glass into a glass sheet having a β-OH value of less than 0.20/mm, and having a thermal shrinkage ratio of 20 ppm or less when increased in temperature from normal temperature at a rate of 5° C./min, kept at a temperature of 500° C. for 1 hour, and decreased in temperature at a rate of 5° C./min. Herein, part of the technical features of the method of producing a glass sheet of the present invention has already been described in the section of the description of the glass sheet of the present invention. Thus, the detailed description of the overlapping portions is omitted.

In general, a production process for the glass sheet comprises a blending step, a melting step, a fining step, a supplying step, a stirring step, and a forming step. The blending step is a step of blending glass raw materials to produce a glass batch. The melting step is a step of melting a glass batch to obtain molten glass. The fining step is a step of fining the molten glass obtained in the melting step by an action of a fining agent or the like. The supplying step is a step of transferring the molten glass from one step to another. The stirring step is a step of stirring the molten glass to homogenize the molten glass. The forming step is a step of forming the molten glass into a sheet shape. A step other than the above-mentioned steps, for example, a state adjusting step of adjusting the molten glass to be in a state suitable for forming may be introduced after the stirring step as required.

Low-alkali glass has been generally melted by combustion heating with a burner. The burner is generally arranged at an upper portion of a melting kiln, and uses fossil fuel as its fuel, specifically, for example, liquid fuel, such as heavy oil, or gas fuel, such as LPG. The combustion flame may be obtained by mixing the fossil fuel and oxygen gas.

However, the combustion heating with a burner is liable to entail an increase in β-OH value because a large amount of water is mixed in the molten glass. In view of the foregoing, the method of producing a glass sheet of the present invention has a feature of comprising heating the glass batch through application of a current with a heating electrode, to thereby control the β-OH value of the glass sheet to less than 0.20/mm. With this, by the heating through application of a current with a heating electrode arranged on a wall surface of the melting kiln, the temperature of the molten glass is reduced from a bottom surface of the melting kiln toward an upper surface of the melting kiln, and hence the glass batch is present under a solid state in a large amount on a liquid surface of the molten glass in the melting kiln. As a result, water having adhered to the glass batch under a solid state evaporates, and thus an increase in water content resulting from the raw material can be suppressed. Further, when the heating through application of a current with a heating electrode is performed, the amount of energy required for obtaining the molten glass per unit mass is reduced, and the amount of a melt volatile is reduced. As a result, an environmental load can be reduced.

In the method of producing a glass sheet of the present invention, it is preferred to perform the heating through application of a current with a heating electrode without performing combustion heating with a burner. When the combustion heating with a burner is performed, water to be generated during combustion of fossil fuel is liable to be mixed in the molten glass. Therefore, when the combustion heating with a burner is not performed, the β-OH value of the molten glass is easily reduced. The "perform the heating through application of a current with a heating electrode without performing combustion heating with a burner" refers to a case of continuously melting the glass batch only by heating through application of a current with a heating electrode, and for example, a case of performing combustion heating with a burner at the time of starting up of the melting kiln, and a case of locally and supplementarily performing combustion heating with a burner at a specific position of the melting kiln are excluded.

The heating through application of a current with a heating electrode is preferably performed by applying an alternating voltage to a heating electrode arranged at a bottom portion or a side portion of a melting kiln so as to be brought into contact with the molten glass in the melting kiln. A material used for the heating electrode preferably has heat resistance and corrosion resistance to the molten glass. For example, tin oxide, molybdenum, platinum, or rhodium may be used. Of those, molybdenum is particularly preferred because of having high heat resistance and a high degree of freedom of arrangement in the melting kiln.

The low-alkali glass, which has a low content of an alkali metal oxide, has high electrical resistivity. Therefore, when the heating through application of a current with a heating electrode is applied to the low-alkali glass, there is a risk in that the current flows not only in the molten glass but also in a refractory constituting the melting kiln, with the result that the refractory is damaged early. In order to prevent such situation, it is preferred to use, as a refractory in a furnace, a zirconia-based refractory having high electrical resistivity, particularly zirconia electrocast bricks. As described above, it is also preferred to introduce a component which reduces the electrical resistivity ($Li_2O$, $Na_2O$, $K_2O$, $Fe_2O_3$, or the like) in the molten glass in a small amount. The content of $ZrO_2$ in the zirconia-based refractory is preferably 85 mass % or more, particularly preferably 90 mass % or more.

EXAMPLES

The present invention is hereinafter described by way of Examples. However, Examples below are merely examples, and the present invention is by no means limited to Examples below.

Examples (Sample Nos. 1 to 8) and Comparative Example (Sample No. 9) of the present invention are shown in Table 1.

The strain point Ps is a value measured in accordance with methods specified in ASTM C336 and ASTM C338.

TABLE 1

|  |  | No. 1 | No. 2 | No. 3 | No. 4 | No. 5 | No. 6 | No. 7 | No. 8 | No. 9 |
|---|---|---|---|---|---|---|---|---|---|---|
| Glass Composition [mol%] | $SiO_2$ | 69.8 | 70.6 | 69.8 | 73.0 | 69.9 | 71.8 | 69.7 | 70.2 | 66.0 |
|  | $Al_2O_3$ | 12.2 | 13.1 | 12.3 | 11.3 | 12.5 | 13.5 | 12.1 | 12.8 | 12.8 |
|  | $B_2O_3$ | 1.1 | 0.3 | 0.7 | 0.3 | 0.6 | 0.1 | 1.5 | 0.7 | 6.4 |
|  | $Na_2O$ | 0.02 | 0.01 | 0.02 | 0.03 | 0.02 | 0.03 | 0.01 | 0.03 | 0.00 |
|  | MgO | 5.5 | 6.0 | 5.6 | 3.1 | 5.5 | 3.4 | 5.4 | 5.3 | 4.2 |
|  | CaO | 6.3 | 3.9 | 6.3 | 7.2 | 6.3 | 4.8 | 6.3 | 6.0 | 7.6 |
|  | SrO | 0.5 | 2.1 | 0.4 | 0.5 | 0.4 | 0.0 | 0.6 | 0.4 | 0.3 |
|  | BaO | 4.5 | 3.9 | 4.7 | 4.5 | 4.7 | 6.3 | 4.3 | 4.5 | 2.5 |
|  | $Fe_2O_3$ | 0.007 | 0.008 | 0.006 | 0.008 | 0.006 | 0.008 | 0.009 | 0.008 | 0.010 |
|  | $SnO_2$ | 0.10 | 0.10 | 0.10 | 0.10 | 0.10 | 0.10 | 0.10 | 0.10 | 0.10 |
|  | $SO_3$ | 0.0002 | 0.0004 | 0.0003 | 0.0003 | 0.0003 | 0.0003 | 0.0002 | 0.0004 | 0.0001 |
|  | Cl | 0.18 | 0.16 | 0.17 | 0.16 | 0.17 | 0.18 | 0.16 | 0.15 | 0.01 |
| Heating method |  | Current application | Current application | Current application | Current application | Current application | Current application | Current application | Indirect | Combustion/ current application |
| β-OH value [/mm] |  | 0.125 | Not measured | 0.097 | Not measured | 0.054 | Not measured | 0.122 | 0.086 | 0.350 |
| Thermal shrinkage value [ppm] |  | 12.7 | Not measured | 12.7 | Not measured | 11.0 | Not measured | 14.1 | 12.1 | 28.0 |
| Ps [° C.] |  | 740 | 740 | 746 | 760 | 750 | 776 | 736 | 750 | 689 |
| Temperature at $10^{2.5}$ poise [° C.] |  | 1,610 | 1,670 | 1,613 | 1,680 | 1,625 | 1,680 | 1,607 | 1,625 | 1,540 |
| TL [° C.] |  | Not measured | 1,246 | Not measured | 1,240 | 1,225 | 1,256 | Not measured | 1,220 | 1,123 |
| LogηTL [poise] |  | Not measured | 5.3 | Not measured | 5.3 | 5.3 | 5.4 | Not measured | 5.3 | 5.6 |

First, a glass batch blended so as to achieve a glass composition shown in the tables was loaded in a small test melting furnace formed of zirconia electrocast bricks, and then melted at from 1,600° C. to 1,650° C. by heating through application of a current with a molybdenum electrode without combustion heating with a burner. Thus, molten glass was obtained. In the case of Sample No. 8, the glass batch was melted by indirect heating with an atmosphere in an electric furnace. In the case of Sample No. 9, the glass batch was melted by adopting combustion heating with an oxygen burner and heating through application of a current with a heating electrode in combination. Subsequently, the molten glass was fined through use of a Pt—Rh vessel, stirred, and then supplied to a zircon forming body and formed into a sheet shape having a thickness of 0.5 mm shown in the table by an overflow down-draw method. The resultant glass sheet was evaluated for a β-OH value, a thermal shrinkage ratio, a strain point Ps, a temperature at a viscosity of $10^{2.5}$ poise, a liquidus temperature TL, and a viscosity at a liquidus temperature log ηTL.

The β-OH value is a value calculated from the above-mentioned equation 1 with an FT-IR.

The thermal shrinkage ratio is measured as described below. A sample is marked with a linear mark at a predetermined position, and then bent perpendicular to the mark to be divided into two glass pieces. Then, one of the glass pieces is subjected to predetermined heat treatment (the glass piece is increased in temperature from normal temperature at a rate of 5° C./min, kept at a temperature of 500° C. for 1 hour, and decreased in temperature at a rate of 5° C./min). After that, the glass piece having been subjected to the heat treatment and another glass piece not having been subjected to the heat treatment are arranged next to each other, and are fixed with an adhesive tape T. Then, a shift between the marks is measured. The thermal shrinkage ratio is determined by the expression $\Delta L/L_0$ (unit: ppm) when the shift is represented by $\Delta L$ and the length of the original sample is represented by $L_0$.

The temperature at a viscosity of $10^{2.5}$ poise is a value measured by a platinum sphere pull up method.

The liquidus temperature TL is a value obtained by measuring a temperature at which a crystal precipitates when glass powder which has passed through a standard 30-mesh sieve (500 μm) and remained on a 50-mesh sieve (300 μm) is placed in a platinum boat and kept for 24 hours in a gradient heating furnace. In addition, the viscosity at a liquidus temperature log ηTL is a value measured by a platinum sphere pull up method.

Figure 2:
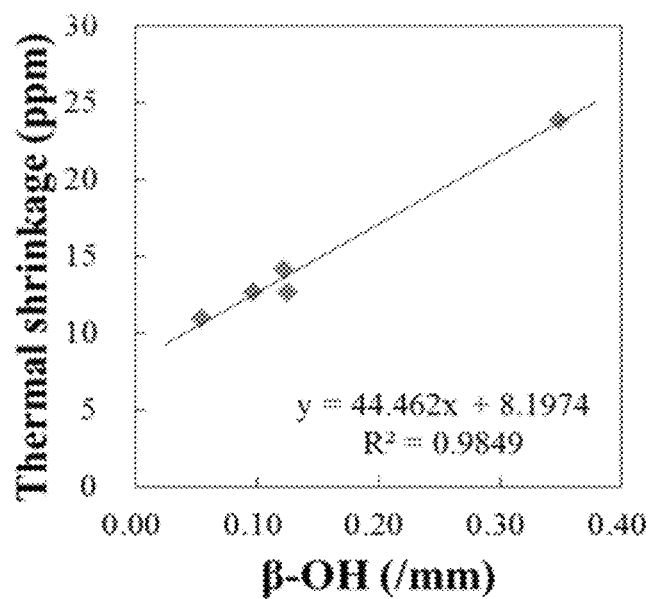
FIG. 2 is a graph for showing a relationship between a β-OH value and a thermal shrinkage ratio in the cases of Sample Nos. 1, 3, 5, 7, and 9 described in the "Examples" section.

FIG. 1 is a graph for showing a relationship between the content of $B_2O_3$ and the β-OH value in the cases of Sample Nos. 1, 3, 5, 7, and 9. From FIG. 1, it is revealed that the water content becomes smaller as the content of $B_2O_3$ becomes smaller. FIG. 2 is a graph for showing a relationship between the β-OH value and the thermal shrinkage ratio in the cases of Sample Nos. 1, 3, 5, 7, and 9. From FIGS. 1 and 2, it is revealed that the thermal shrinkage ratio becomes lower as the content of $B_2O_3$ becomes smaller.

As apparent from Table 1, Sample Nos. 1 to 8 each had a small content of $B_2O_3$ and a small β-OH value, and hence had a high strain point and a low thermal shrinkage ratio. Moreover, Sample Nos. 1 to 8 each had a low liquidus temperature, and hence had high devitrification resistance. Therefore, Sample Nos. 1 to 8 each satisfy the above-mentioned demand characteristics (1) and (2). Meanwhile, Sample No. 9 had a large content of $B_2O_3$ and a large β-OH value, and hence had a low strain point and a high thermal shrinkage ratio. When Sample No. 5 and Sample No. 8 are compared, it is revealed that the water content in the glass can be reduced more effectively in the case of performing heating through application of a current with a heating electrode without performing combustion heating with a burner than in the case of performing indirect heating with an atmosphere in an electric furnace.

INDUSTRIAL APPLICABILITY

Other than as a substrate of a flat panel display, such as a liquid crystal display or an OLED display, the glass sheet of the present invention is suitable, for example, as a carrier glass for a polyimide OLED (p-OLED), a cover glass for an image sensor, such as a charge coupled device (CCD) or a contact image sensor (CIS), a substrate or a cover glass of a solar cell, or a substrate for an OLED lighting device.

The invention claimed is:

1. A glass sheet, which has a content of $Li_2O+Na_2O+K_2O$ of from 0 mol % to less than 1.0 mol %, a content of $B_2O_3$ of from 0.01 mol % to less than 1.0 mol %, a content of CaO of from 2 mol % to 7 mol %, and a content of $Fe_2O_3$ of from 10 molppm to 85.71 molppm in a glass composition,
   which has a β-OH value of less than 0.20/mm, and
   which has a thermal shrinkage ratio of 20 ppm or less when increased in temperature from normal temperature at a rate of 5° C./min, kept at a temperature of 500° C. for 1 hour, and decreased in temperature at a rate of 5° C./min,
   wherein a molar ratio $Fe_2O_3/B_2O_3$ is from 0.003 to 0.008571.

2. The glass sheet according to claim 1, wherein the glass sheet has a content of $B_2O_3$ of from 0.01 mol % to less than 1.0 mol % in the glass composition, and has a β-OH value of 0.15/mm or less.

3. The glass sheet according to claim 1, wherein the glass sheet has a thickness of from 0.03 mm to 0.6 mm, and comprises as a glass composition 60 mol % to 75 mol % of $SiO_2$, 8 mol % to 16 mol % of $Al_2O_3$, 0.01 mol % to less than 1.0 mol % of $B_2O_3$, 0 mol % to less than 1.0 mol % of $Li_2O+Na_2O+K_2O$, 1 mol % to 7 mol % of MgO, 2 mol % to 7 mol % of CaO, 0 mol % to 5 mol % of SrO, 0 mol % to 7 mol % of BaO, 0 mol % to less than 0.050 mol % of $As_2O_3$, 0 mol % to less than 0.050 mol % of $Sb_2O_3$, and 10 molppm to 85.71 molppm of $Fe_2O_3$.

4. The glass sheet according to claim 1, wherein the glass sheet has a content of $Na_2O$ of 100 ppm or more and less than 600 ppm on a molar basis in the glass composition.

5. The glass sheet according to claim 1, wherein the glass sheet has a strain point of 710° C. or more.

6. The glass sheet according to claim 1, wherein the glass sheet has a liquidus temperature of 1,300° C. or less.

7. The glass sheet according to claim 1, wherein the glass sheet has a temperature at a viscosity of $10^{2.5}$ dPa·s of 1,680° C. or less.

8. The glass sheet according to claim 1, wherein the glass sheet comprises a formed joined surface located at a center portion of the glass sheet in a thickness direction of the glass sheet.

9. The glass sheet according to claim 1, wherein the glass sheet is used as a substrate of an OLED device.

10. A method of producing the glass sheet according to claim 1, the method, comprising:
   a blending step of blending a glass batch so as to obtain glass comprising as a glass composition, in terms of mol %, 60% to 75% of $SiO_2$, 8% to 16% of $Al_2O_3$, 0.01% to less than 1.0% of $B_2O_3$, 0% to less than 1.0% of $Li_2O+Na_2O+K_2O$, 1% to 7% of MgO, 2% to 7% of CaO, 0% to 5% of SrO, 0% to 7% of BaO, 0% to less than 0.050% of $As_2O_3$, and 0% to less than 0.050% of $Sb_2O_3$;
   a melting step of heating the resultant glass batch through application of a current with a heating electrode to obtain molten glass; and
   a forming step of forming, by an overflow down-draw method, the resultant molten glass into a glass sheet having a β-OH value of less than 0.20/mm, and having a thermal shrinkage ratio of 20 ppm or less when increased in temperature from normal temperature at a rate of 5° C./min, kept at a temperature of 500° C. for 1 hour, and decreased in temperature at a rate of 5° C./min.

11. The method of producing a glass sheet according to claim 10, wherein the melting step comprises heating the resultant glass batch through application of a current with a molybdenum electrode to obtain the molten glass.

12. The method of producing a glass sheet according to claim 10, wherein the forming step comprises forming the resultant molten glass into a glass sheet having a thickness of from 0.03 mm to 0.6 mm.

13. The glass sheet according to claim 2, wherein the glass sheet has a thickness of from 0.03 mm to 0.6 mm, and comprises as a glass composition 60 mol % to 75 mol % of $SiO_2$, 8 mol % to 16 mol % of $Al_2O_3$, 0.01 mol % to less than 1.0 mol % of $B_2O_3$, 0 mol % to less than 1.0 mol % of $Li_2O+Na_2O+K_2O$, 1 mol % to 7 mol % of MgO, 2 mol % to 7 mol % of CaO, 0 mol % to 5 mol % of SrO, 0 mol % to 7 mol % of BaO, 0 mol % to less than 0.050 mol % of $As_2O_3$, 0 mol % to less than 0.050 mol % of $Sb_2O_3$, and 10 molppm to 85.71 molppm of $Fe_2O_3$.

14. The method of producing a glass sheet according to claim 11, wherein the forming step comprises forming the resultant molten glass into a glass sheet having a thickness of from 0.03 mm to 0.6 mm.

* * * * *